United States Patent
Reuter et al.

(10) Patent No.: US 11,276,594 B2
(45) Date of Patent: Mar. 15, 2022

(54) SYSTEMS, APPARATUS, AND METHODS FOR AN IMPROVED LOAD PORT BACKPLANE

(71) Applicant: Applied Materials, Inc., Santa Clara, CA (US)

(72) Inventors: Paul B. Reuter, Austin, TX (US); Douglas B. Baumgarten, Round Rock, TX (US)

(73) Assignee: Applied Materials, Inc., Santa Clara, CA (US)

( * ) Notice: Subject to any disclaimer, the term of this patent is extended or adjusted under 35 U.S.C. 154(b) by 45 days.

(21) Appl. No.: 16/742,567

(22) Filed: Jan. 14, 2020

(65) Prior Publication Data
US 2020/0152497 A1 May 14, 2020

Related U.S. Application Data

(62) Division of application No. 15/348,964, filed on Nov. 10, 2016, now Pat. No. 10,541,165.

(51) Int. Cl.
*H01L 21/677* (2006.01)
*H01L 21/673* (2006.01)

(52) U.S. Cl.
CPC .. *H01L 21/67383* (2013.01); *H01L 21/67772* (2013.01); *H01L 21/67775* (2013.01)

(58) Field of Classification Search
CPC ......... H01L 21/67772; H01L 21/67775; H01L 21/67383
See application file for complete search history.

(56) References Cited

U.S. PATENT DOCUMENTS

| | | | |
|---|---|---|---|
| 4,674,939 A | * | 6/1987 | Maney ............. H01L 21/67772 414/217 |
| 6,883,770 B1 | | 4/2005 | Miyajima et al. |
| 10,159,169 B2 | | 12/2018 | Vincent et al. |
| 10,262,884 B2 | | 4/2019 | Bonecutter et al. |
| 10,453,726 B2 | | 10/2019 | Blahnik et al. |
| 10,453,727 B2 | | 10/2019 | Bonecutter |
| 2003/0000898 A1 | | 1/2003 | Elliott |
| 2003/0044268 A1 | | 3/2003 | Bonora et al. |
| 2003/0091409 A1 | | 5/2003 | Danna et al. |
| 2004/0006883 A1 | | 1/2004 | Wu et al. |

(Continued)

FOREIGN PATENT DOCUMENTS

WO 2008008738 A2 1/2017

OTHER PUBLICATIONS

International Search Report and Written Opinion dated Feb. 22, 2018 PCT/US2017/060952.

(Continued)

*Primary Examiner* — Saul Rodriguez
*Assistant Examiner* — Ashley K Romano
(74) *Attorney, Agent, or Firm* — Lowenstein Sandler LLP

(57) ABSTRACT

A method is for sealing a backplane component of a load port system to an equipment front end module (EFEM). The method includes mounting a leveling block to the EFEM. A conical hole adjustment assembly is coupled between a first distal end of the leveling block and the backplane component. The method further includes rotating a first leveling adjustment bolt in the conical hole adjustment assembly to align the backplane component with the EFEM.

20 Claims, 7 Drawing Sheets

(56) References Cited

U.S. PATENT DOCUMENTS

| | | |
|---|---|---|
| 2004/0013498 A1 | 1/2004 | Soucy et al. |
| 2006/0120833 A1 | 6/2006 | Bonora et al. |
| 2007/0009345 A1 | 1/2007 | Hall et al. |
| 2009/0110518 A1 | 4/2009 | Rice et al. |
| 2013/0152859 A1 | 6/2013 | Collins et al. |
| 2013/0162117 A1 | 6/2013 | Hara et al. |
| 2013/0306832 A1 | 11/2013 | Wang et al. |
| 2014/0263938 A1 | 9/2014 | Hara et al. |
| 2015/0045961 A1 | 2/2015 | Koshti et al. |
| 2015/0221538 A1 | 8/2015 | Ochiai et al. |
| 2016/0147235 A1 | 5/2016 | Rice et al. |

OTHER PUBLICATIONS

International Search Report and Written Opinion of International Application No. PCT/US2017/060985, dated Feb. 22, 2018.

* cited by examiner

SYSTEMS, APPARATUS, AND METHODS FOR AN IMPROVED LOAD PORT BACKPLANE

RELATED APPLICATION

This application is a divisional application of U.S. patent application Ser. No. 15/348,964, filed on Nov. 10, 2016, the entire content of which is incorporated by reference herein.

FIELD

The present application relates to electronic device manufacturing systems, and more specifically to systems, apparatus, and methods for an improved load port backplane.

BACKGROUND

Equipment front end modules (EFEMs), sometimes referred to as factory interfaces (FIs), provide a non-reactive environment for transferring substrates from carriers to processing tools. This is achieved by sealing the interior volume of the EFEM as much as is practical and flooding the interior volume with a gas such as nitrogen that is generally non-reactive with substrate materials. The non-reactive gas forces out any reactive gases such as oxygen from the EFEM. A load port for docking a substrate carrier is typically attached to the front face of an EFEM. The load port includes a backplane that ideally is sealed against the face of the EFEM. However, it can be difficult to reliably seal a conventional backplane against the EFEM. Thus, what is needed are systems, apparatus, and methods for an improved load port backplane.

SUMMARY

In some embodiments, a load port system is provided. The system includes a backplane assembly supporting a docking tray and a substrate carrier opener, wherein the backplane assembly includes a backplane; a leveling block coupleable to an equipment front end module (EFEM); a conical hole adjustment assembly coupled between the leveling block and the backplane; and a slotted hole adjustment assembly coupled between the leveling block and the backplane. The conical hole adjustment assembly includes a conical hole block coupled to the leveling block at a first end; a threaded block coupled to the backplane; and an adjustment bolt coupled to the conical hole block and the threaded block.

In some other embodiments, a backplane assembly is provided. The backplane assembly includes a backplane; a leveling block coupleable to an equipment front end module (EFEM); a conical hole adjustment assembly coupled between the leveling block and the backplane; and a slotted hole adjustment assembly coupled between the leveling block and the backplane. The conical hole adjustment assembly includes a conical hole block coupled to the leveling block at a first end; a threaded block coupled to the backplane; and an adjustment bolt coupled to the conical hole block and the threaded block.

In yet other embodiments, a method of sealing a load port backplane to an Equipment Front End Module (EFEM) is provided. The method includes providing a load port including a backplane assembly having a leveling block coupled to a backplane of the load port with a conical hole adjustment assembly and a slotted adjustment assembly; coupling the leveling block to the EFEM; and rotating a leveling adjustment bolt in the conical hole adjustment assembly to adjust roll of the backplane.

Still other features, aspects, and advantages of embodiments will become more fully apparent from the following detailed description, the appended claims, and the accompanying drawings by illustrating a number of exemplary embodiments and implementations, including the best mode contemplated for carrying out the embodiments. Embodiments of may also be capable of other and different applications, and its several details may be modified in various respects, all without departing from the spirit and scope of the disclosed embodiments. Accordingly, the drawings and descriptions are to be regarded as illustrative in nature, and not as restrictive. The drawings are not necessarily drawn to scale. The description is intended to cover all modifications, equivalents, and alternatives falling within the spirit and scope of the claims.

DETAILED DESCRIPTION

Embodiments described herein provide systems, apparatus, and methods for an improved load port backplane that allows a load port to be reliably sealed to an equipment front end module (EFEM) of an electronic device manufacturing system. An EFEM typically includes a transfer robot in an enclosed, positive pressure, non-reactive gas (e.g., nitrogen) environment and the EFEM is mounted to a substrate processing tool. The EFEM enables transfer of substrates (e.g., without exposure to reactive gases or other contamination) between a substrate carrier docked on a load port (e.g., in a cleanroom environment) and the substrate processing tool. A seal is maintained between the backplane of the load port and the EFEM. However, due to the weight of the load port, it can be difficult to secure a conventional load port backplane to the front face of the EFEM so that the two surfaces are coplanar and the seal is evenly compressed. In other words, conventional backplanes do not include mounting hardware that easily enables adjustment of the backplane relative to the front face of the EFEM. Unlike conventional backplane mounting systems, the novel embodiments described herein include the use of a leveling block with spherical washers and a conical hole mounting block that facilitate both pitch and roll adjustments to the orientation of the backplane so that the surface of the backplane can be aligned with and made coplanar with the front surface of the EFEM so a sealing member can be evenly compressed.

Figure 1:
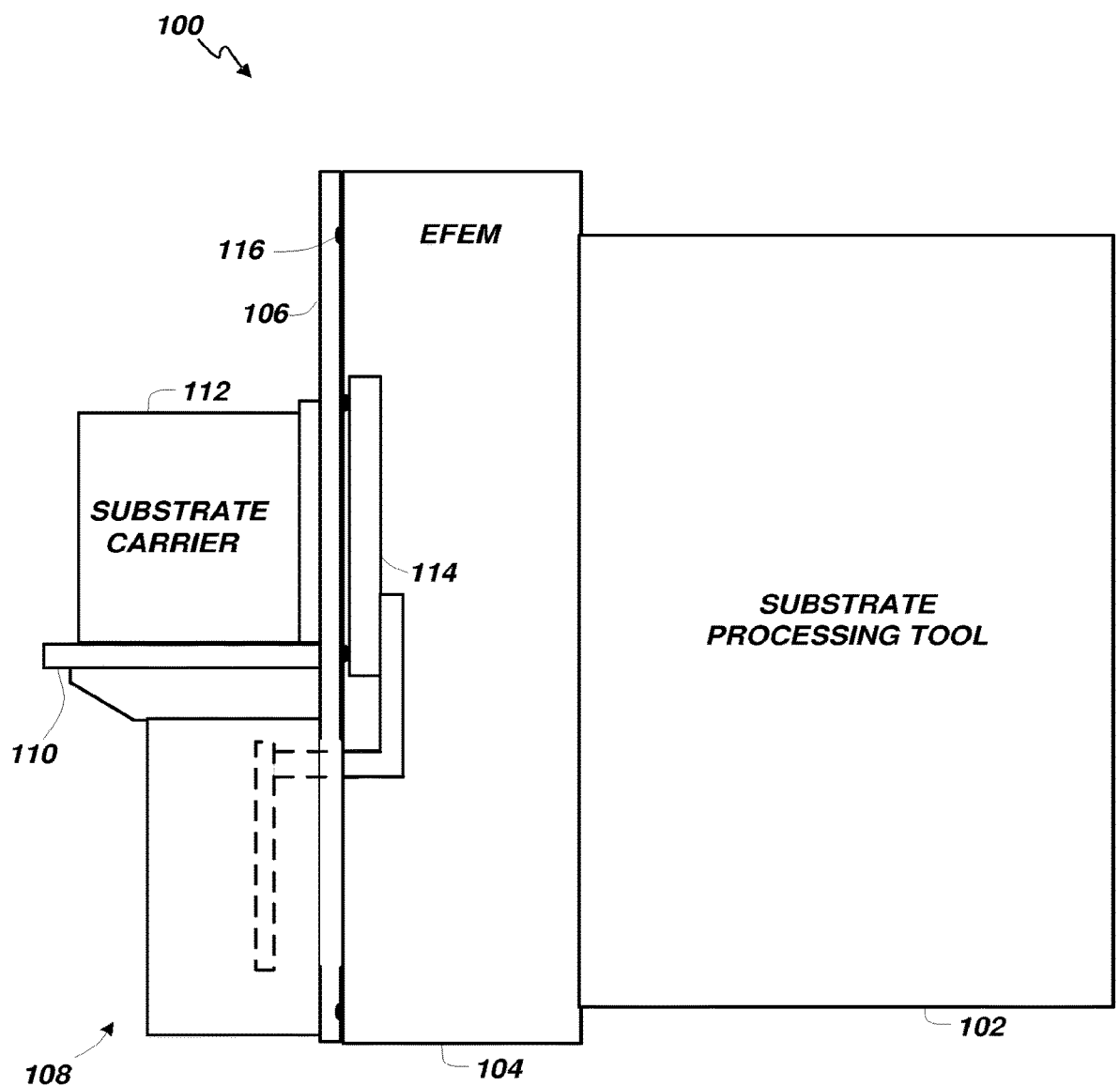
FIG. 1 is a block diagram depicting an example of an electronic device processing system according to some embodiments.
Figure 2A:
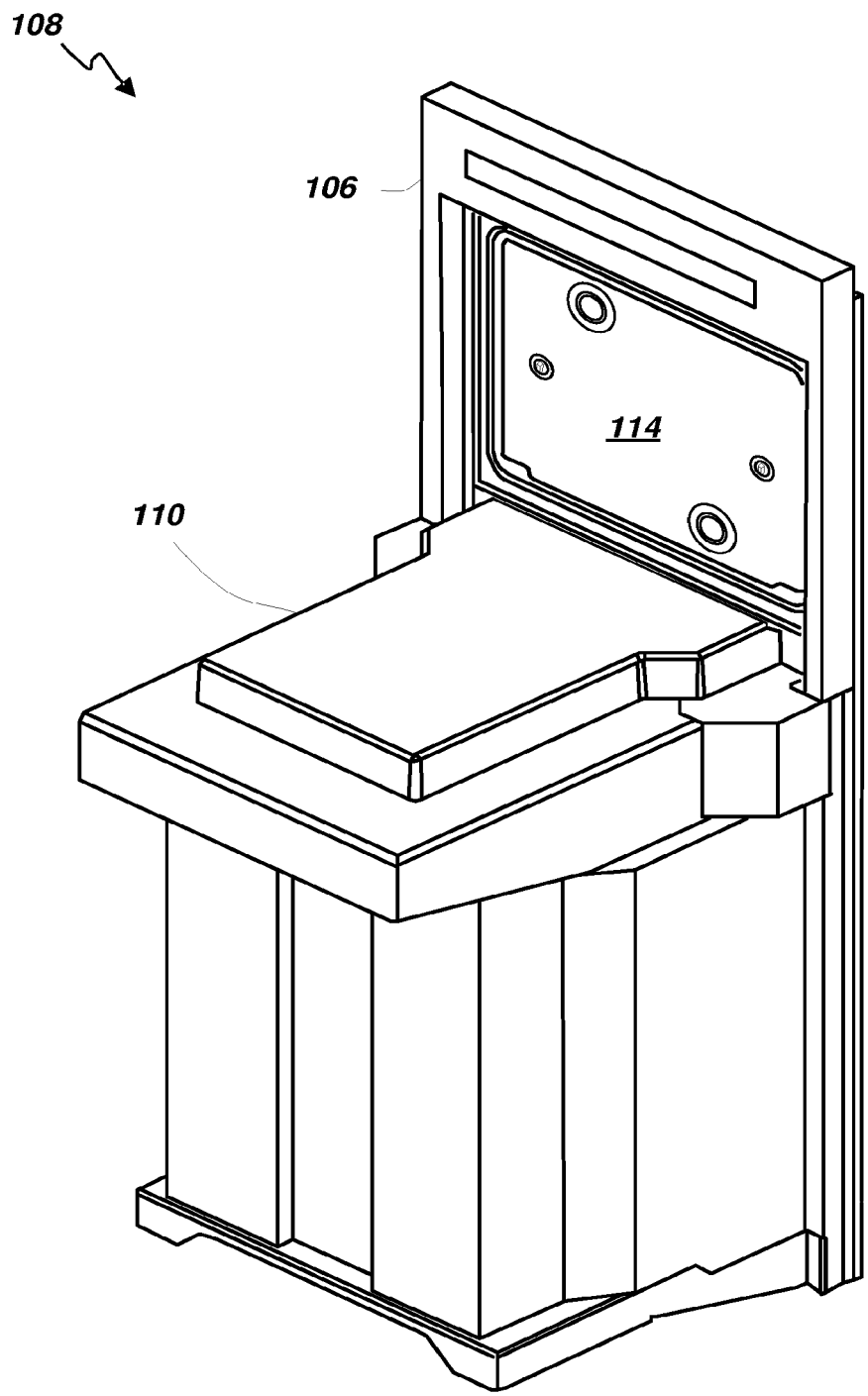
FIG. 2A is a front isometric view diagram depicting example load port according to some embodiments.
Figure 2B:
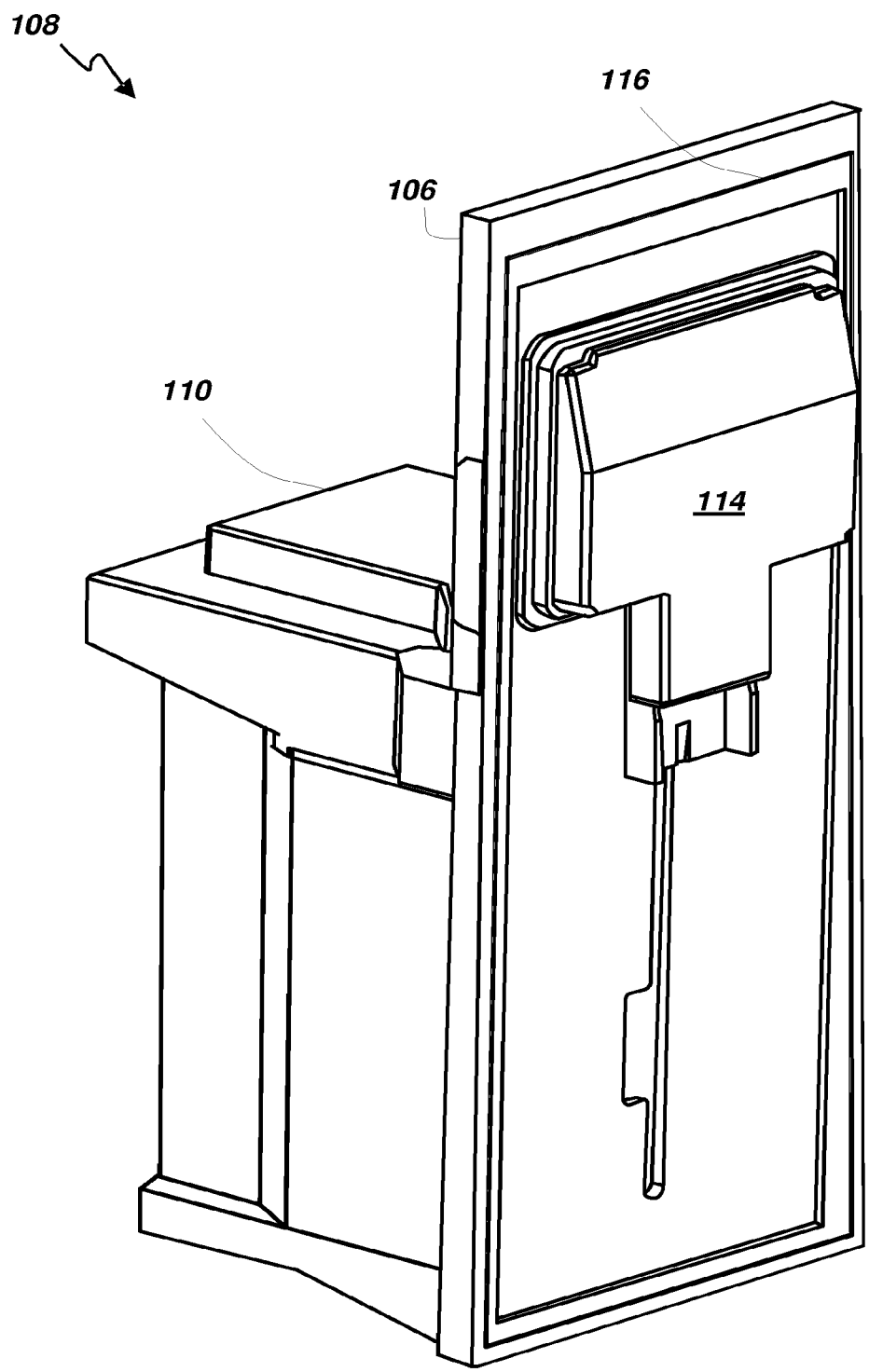
FIG. 2B is a rear isometric view diagram depicting an example load port according to some embodiments.

Turning to FIG. 1, a block diagram of an example electronic device processing system 100 according to some embodiments is shown. The system 100 includes a substrate processing tool 102 coupled to an EFEM 104. The EFEM 104 is coupled to a backplane 106 of a load port 108. A docking tray 110 of the load port 108 is adapted to support a substrate carrier 112 which can be opened by a substrate carrier opener 114 of the load port 108. The backplane 106 is mounted on the EFEM 104 with a compressible seal 116 that runs along the periphery of the major surface of the backplane 106. To compress the seal 116 evenly, the major surface of the backplane 106 facing the EFEM 104 is adjusted to be aligned with and coplanar with the EFEM 104 front facing surface. FIGS. 2A and 2B depict front and rear isometric views of the load port 108, respectively. The compressible seal 116 is shown on the rear surface of the backplane 106.

Figure 3:
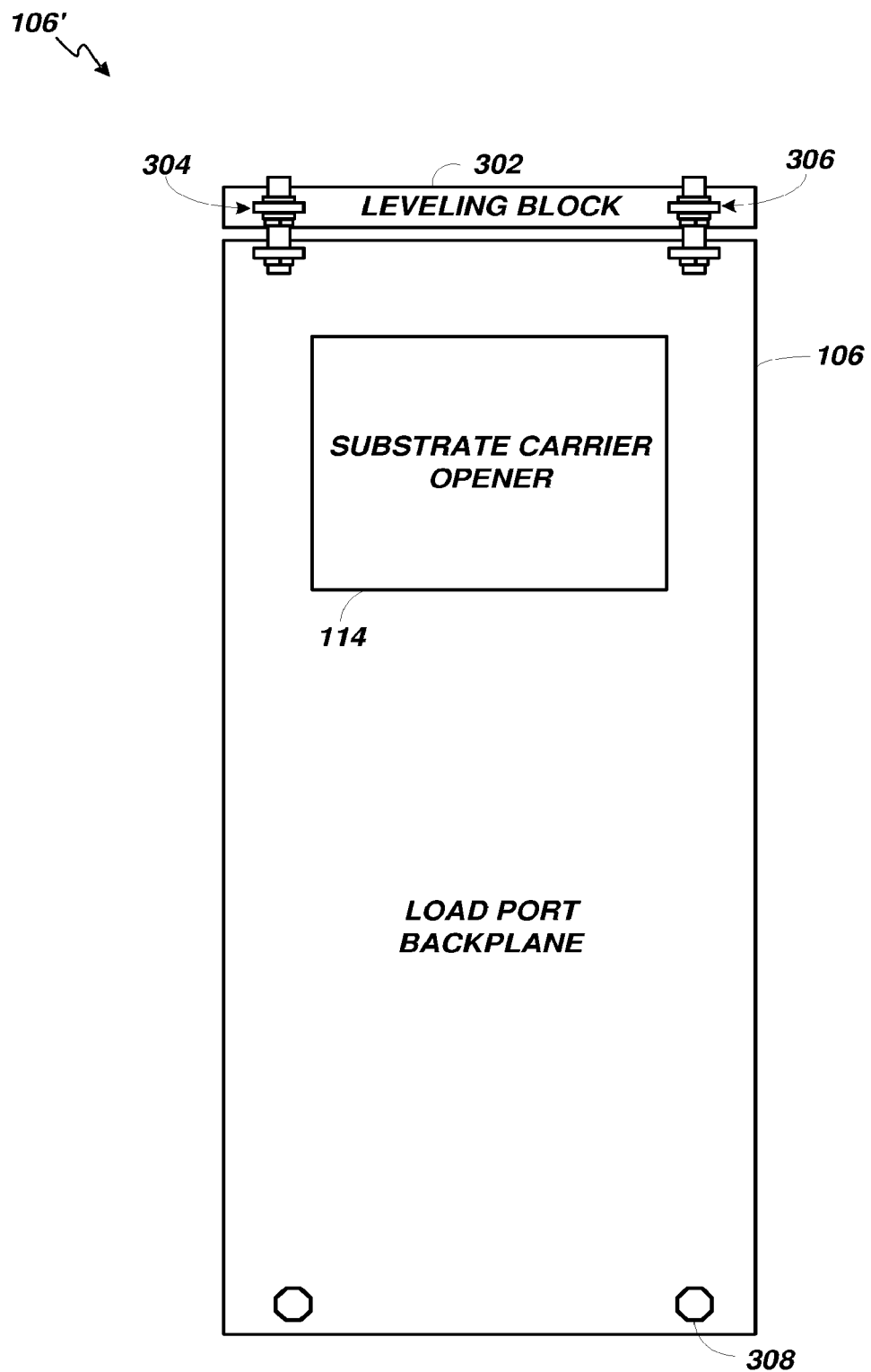
FIG. 3 is a rear plan view diagram depicting an example load port backplane assembly according to some embodiments.

Turning to FIG. 3, a detailed front plan view of a backplane assembly 106' is shown. In addition to the backplane 106, the backplane assembly 106' includes a leveling block 302, conical hole adjustment hardware 304, slotted adjustment hardware 306, and lower attachment assembly 308 (e.g., bolts, screws, or other fasteners). The leveling block 302 attaches to the face of the EFEM 104. For example, the leveling block 302 can be bolted directly to the front facing surface of the EFEM 104. As will be described in more detail below with respect to FIGS. 4A and 4B, conical hole adjustment hardware 304 and slot adjustment hardware 306 both support the backplane 106 and allow the backplane 106 to be adjusted in terms of pitch (e.g., tilt backward into and forward out of the paper) and roll (e.g., clockwise and counter-clockwise rotation).

Figure 4A:
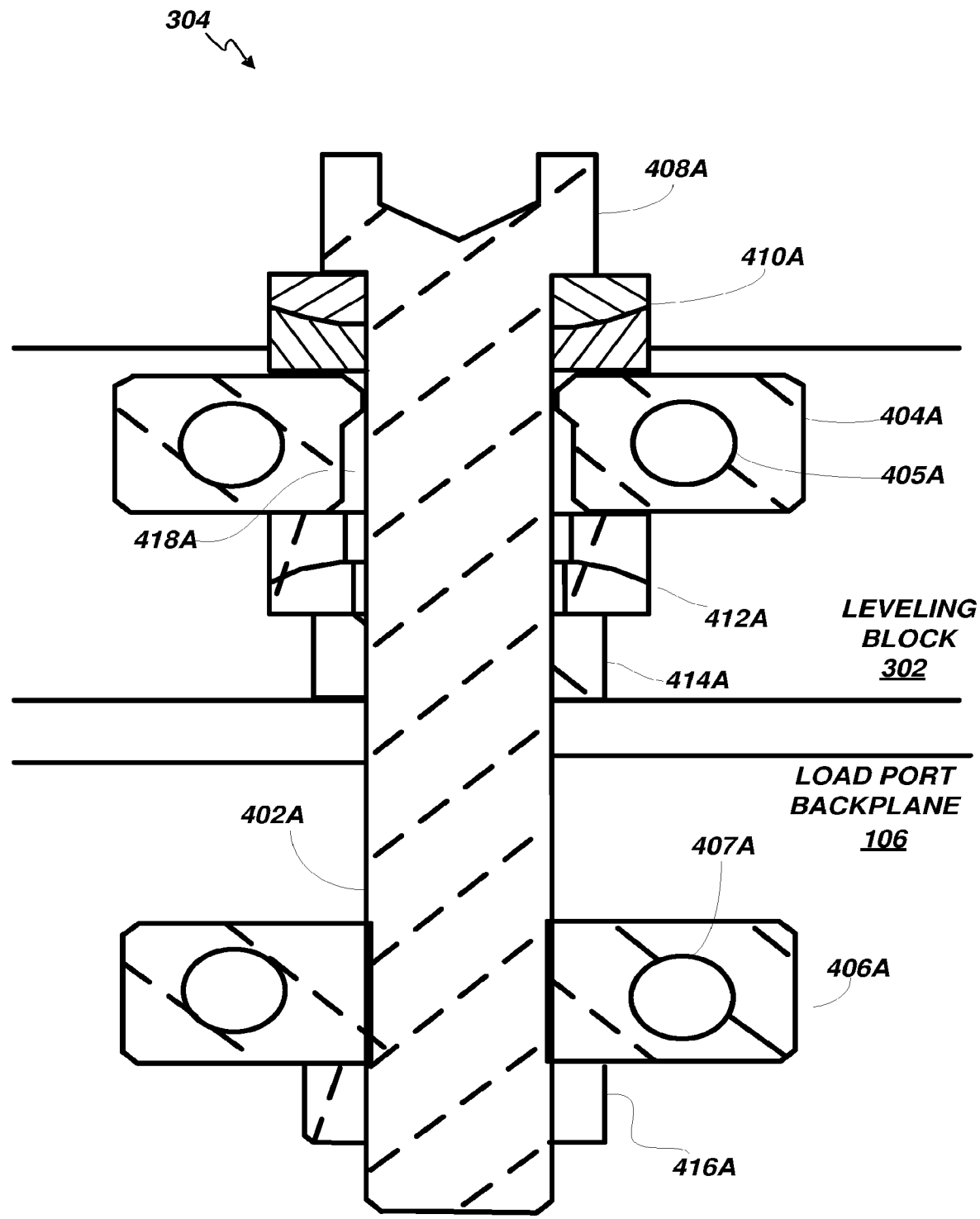
FIG. 4A is a cross-sectional view diagram depicting a first backplane adjustment mechanism according to some embodiments.

FIG. 4A is a magnified cross-section view of the conical hole adjustment hardware 304. A leveling adjustment bolt 402A extends from the leveling block 302 to the backplane 106. The leveling adjustment bolt 402A is coupled to the leveling block 302 via a conical hole block 404A which is coupled to the leveling block 302 via bolts 405A. The leveling adjustment bolt 402A is coupled to the backplane 106 via a threaded hole block 406A which is coupled to the backplane 106 via bolts 407A. The head 408A of the leveling adjustment bolt 402A rests on a first spherical washer pair 410A which rests on the conical hole 404A. Below the conical hole block 404A, a second spherical washer pair 412A is secured against the conical hole block 404A by a first lock nut 414A. A second lock nut 416A is used to secure the leveling adjustment bolt 402A in the threaded hole block 406A.

The conical hole block 404A includes a hole that is expanded in the lower portion of the block to create an annular gap 418A around the leveling adjustment bolt 402A. This annular gap 418A provides space for the leveling adjustment bolt 402A to swivel when adjustments are made. In some embodiments, the annular gap 418A can be formed by making the through hole in the conical hole block 404A have two different diameters (e.g., smaller in the upper portion and larger in the lower portion) or by forming the through hole with a conical or tapering shape. As shown in FIG. 4A, the top and bottom openings of the through hole in the conical hole block 404A can be beveled to provide further clearance for swivel of the leveling adjustment bolt 402A. In some embodiments, the annular gap 418A is large enough to accommodate approximately 0.25 degrees to approximately 2 degrees of swivel during adjustment. In some embodiments, the through hole in the conical hole block 404A is approximately 1.05 times to approximately 1.1 times the diameter of the leveling adjustment bolt 402A. Further, by using the first and second spherical washer pairs 410A, 412A, binding of the leveling adjustment bolt 402A (e.g., due to the weight of the supported backplane 106) is avoided and the leveling adjustment bolt 402A is better able to swivel in the conical hole block 404A.

In operation, before the lock nuts 414A, 416A are tightened, turning the leveling adjustment bolt 402A clockwise, raises the left side of the backplane 106 (e.g., adjusts the roll of the backplane 106 in the clockwise direction) and turning the leveling adjustment bolt 402A counter-clockwise, lowers the left side of the backplane 106 (e.g., adjusts the roll of the backplane 106 in the counter-clockwise direction) As the roll of the backplane 106 is adjusted, the leveling adjustment bolt 402A swivels in the conical hole block 404A.

Figure 4B:
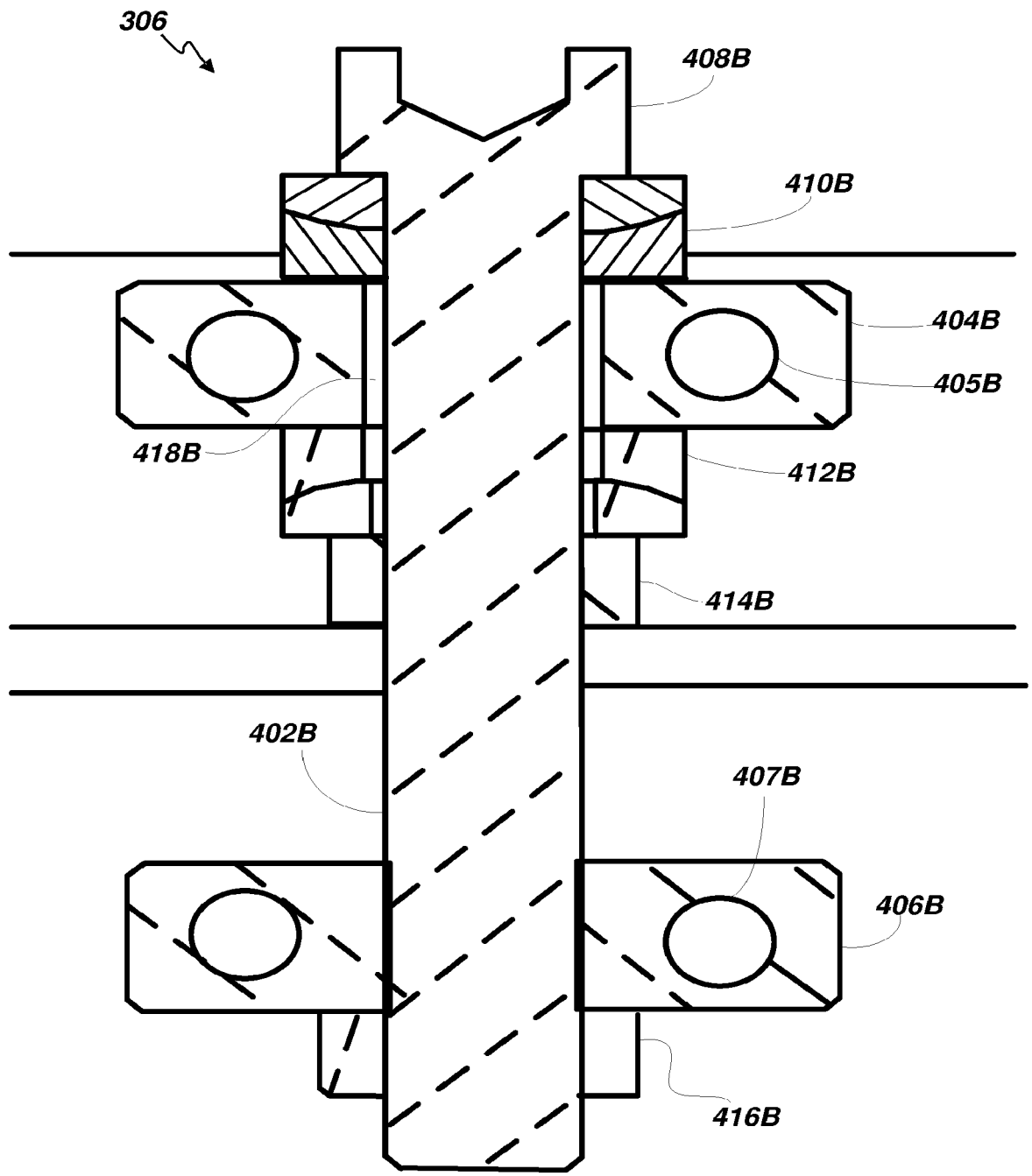
FIG. 4B is a cross-sectional view diagram depicting a second backplane adjustment mechanism according to some embodiments.

FIG. 4B is a magnified cross-section view of the slotted adjustment hardware 306. A leveling adjustment bolt 402B extends from the leveling block 302 to the backplane 106. The leveling adjustment bolt 402B is coupled to the leveling block 302 via a slotted block 404B which is coupled to the leveling block 302 via bolts 405B. The leveling adjustment bolt 402B is coupled to the backplane 106 via a threaded hole block 406B which is coupled to the backplane 106 via bolts 407B. The head 408B of the leveling adjustment bolt 402B rests on a first spherical washer pair 410B which rests on the slotted block 404B. Below the slotted block 404B, a second spherical washer pair 412B is secured against the slotted block 404B by a first lock nut 414B. A second lock nut 416B is used to secure the leveling adjustment bolt 402B in the threaded hole block 406B.

The slotted block 404B includes a slot 418B that has a longitudinal dimension that extends in the same direction as the longitudinal dimension of the slotted block 404B. This arrangement allows freedom of motion in the roll directions but restricts motion in the pitch directions. In other words, the leveling adjustment bolt 402B is free to swivel clockwise and counter-clockwise but is restricted from tilting forward and back.

In operation, before the lock nuts 414B, 416B are tightened, turning the leveling adjustment bolt 402B clockwise, raises the right side of the backplane 106 (e.g., adjusts the roll of the backplane 106 in the counter-clockwise direction) and turning the leveling adjustment bolt 402B counter-clockwise, lowers the right side of the backplane 106 (e.g., adjusts the roll of the backplane 106 in the clockwise direction). As the roll of the backplane 106 is adjusted, the leveling adjustment bolt 402B swivels in the slotted block 404B.

The combination a conical hole block 404A on one side of the leveling block 302 (that restricts the leveling adjustment bolt 402A to a fixed position but allows both pitch and roll swivel) and a slotted block 404B on the other side (that accommodates lateral adjustment and roll swivel) enables improved ease of mounting and adjusting of the load port backplane 106 to the EFEM 104. Another benefit of the conical hole block 404A and slotted block 404B configuration is to ensure positional repeatability of the load port backplane 106 with respect to the EFEM 104. Thus, the hole block 404A arrangement can serve as the reference point about which all other load port position/orientation adjustments are made.

Figure 5:
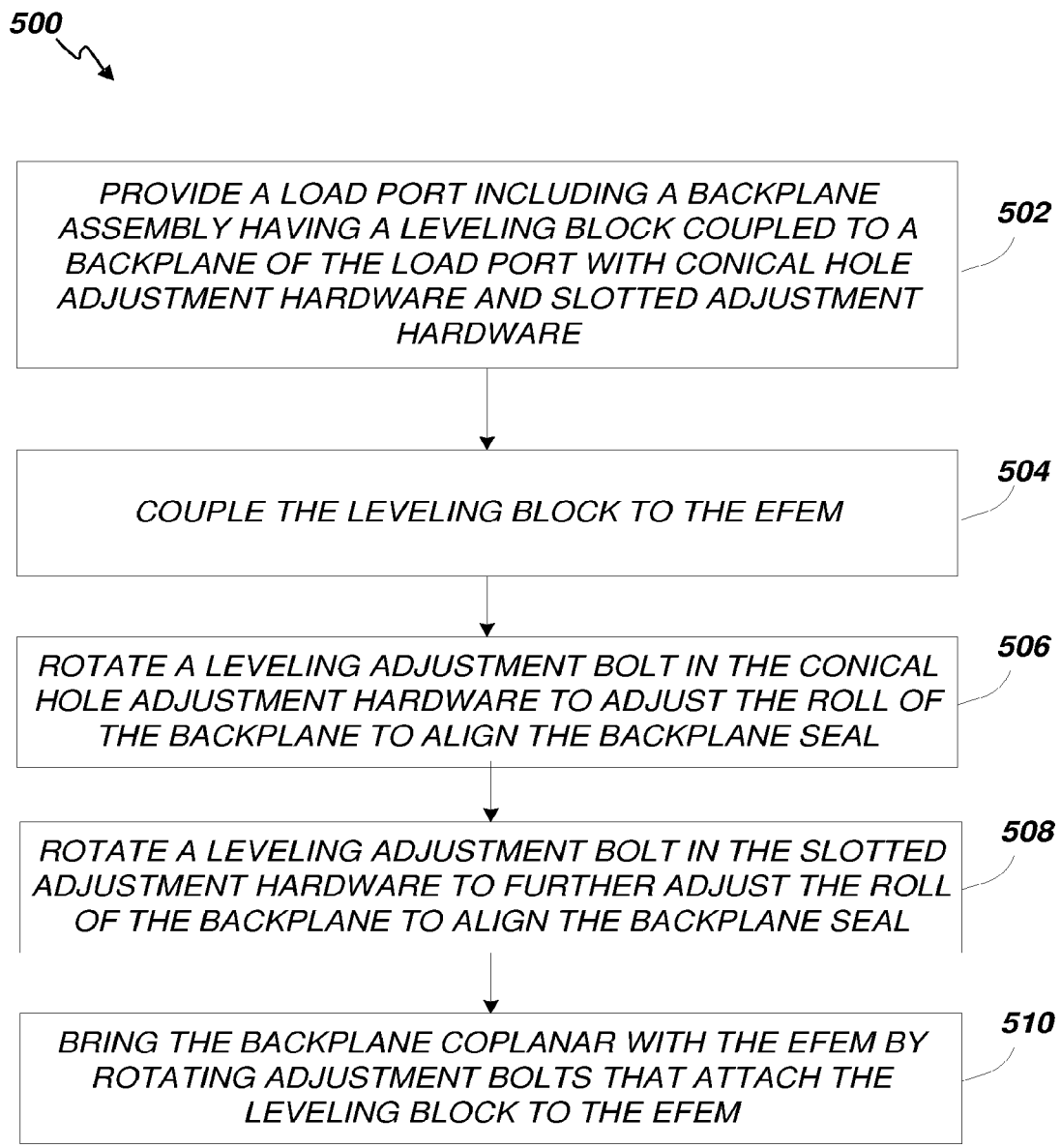
FIG. 5 is a flowchart illustrating an example method according to some embodiments.

Turning now to FIG. 5, a flowchart depicting an example method 500 of sealing a load port backplane to an EFEM is depicted. A load port including a backplane assembly having a leveling block coupled to a backplane of the load port with conical hole adjustment hardware 304 on one of the leveling block and slotted adjustment hardware 306 on the other end is provided (502). The leveling block is coupled to the EFEM (504). A leveling adjustment bolt in the conical hole adjustment hardware is rotated to adjust the roll of the backplane to align a seal on the backplane relative to a desired position on the EFEM (506). A leveling adjustment bolt in the slotted adjustment hardware is rotated to further adjust the roll to align the seal on the backplane relative to the desired position on the EFEM (508). Adjustment bolts attaching the leveling block to the EFEM are adjusted to bring the backplane coplanar with the front surface of the EFEM (510).

Numerous embodiments are described in this disclosure, and are presented for illustrative purposes only. The described embodiments are not, and are not intended to be, limiting in any sense. The presently disclosed embodiments are widely applicable to numerous other embodiments, as is readily apparent from the disclosure. One of ordinary skill in the art will recognize that the disclosed embodiments may be practiced with various modifications and alterations, such as structural, logical, software, and electrical modifications. Although particular features of the disclosed embodiments may be described with reference to one or more particular embodiments and/or drawings, it should be understood that such features are not limited to usage in the one or more particular embodiments or drawings with reference to which they are described, unless expressly specified otherwise.

The present disclosure is neither a literal description of all embodiments nor a listing of features of the embodiments that must be present in all embodiments. The present disclosure provides, to one of ordinary skill in the art, an enabling description of several embodiments. Some of these embodiments may not be claimed in the present application, but may nevertheless be claimed in one or more continuing applications that claim the benefit of priority of the present application.

The foregoing description discloses only example embodiments. Modifications of the above-disclosed apparatus, systems and methods which fall within the scope of the claims will be readily apparent to those of ordinary skill in the art. Accordingly, while the embodiments have been disclosed in connection with exemplary embodiments thereof, it should be understood that other embodiments may fall within the intended spirit and scope, as defined by the following claims.

What is claimed is:

1. A method of sealing a backplane component of a load port system to an equipment front end module (EFEM), the method comprising:
    mounting a leveling block to the EFEM, wherein a hole adjustment assembly is coupled between a first distal end of the leveling block and the backplane component; and
    rotating a first leveling adjustment bolt in the hole adjustment assembly to align the backplane component with the EFEM.

2. The method of claim 1 further comprising:
    mounting a hole block of the hole adjustment assembly to the first distal end of the leveling block;
    mounting a first threaded block of the hole adjustment assembly to the backplane component; and
    coupling, via the first leveling adjustment bolt of the hole adjustment assembly, the hole block with the first threaded block.

3. The method of claim 2 further comprising disposing first spherical washers adjacent the hole block on the first leveling adjustment bolt, wherein the hole adjustment assembly is a conical hole adjustment assembly.

4. The method of claim 1, wherein the hole adjustment assembly forms a through-hole having:
    a first diameter at a lower end large enough to allow the first leveling adjustment bolt to swivel in the through-hole; and
    a second diameter at an upper end small enough to retain the first leveling adjustment bolt at a fixed location.

5. The method of claim 1, wherein a slotted adjustment assembly is coupled between a second distal end of the leveling block and the backplane component.

6. The method of claim 5 further comprising:
    coupling a first pitch adjustment bolt to the first distal end of the leveling block;
    coupling a second pitch adjustment bolt to the second distal end of the leveling block; and
    rotating one or more of the first pitch adjustment bolt or the second pitch adjustment bolt to cause the backplane component to be substantially coplanar with the EFEM.

7. The method of claim 5, wherein the backplane component comprises a seal, and wherein the hole adjustment assembly and the slotted adjustment assembly are operable to align the seal with the EFEM.

8. The method of claim 5 further comprising rotating a second leveling adjustment bolt in the slotted adjustment assembly to further align the backplane component with the EFEM.

9. The method of claim 8 further comprising:
    mounting a slotted block of the slotted adjustment assembly to the second distal end of the leveling block;
    mounting a second threaded block of the slotted adjustment assembly to the backplane component; and
    coupling, via the second leveling adjustment bolt of the slotted adjustment assembly, the slotted block with the second threaded block.

10. The method of claim 9 further comprising disposing second spherical washers adjacent the slotted block on the second leveling adjustment bolt.

11. A method of sealing a backplane component of a load port system to an equipment front end module (EFEM), the method comprising:
    mounting a leveling block to the EFEM, wherein a slotted adjustment assembly is coupled between a first distal end of the leveling block and the backplane component; and
    rotating a first leveling adjustment bolt in the slotted adjustment assembly to align the backplane component with the EFEM.

12. The method of claim 11 further comprising:
    mounting a slotted block of the slotted adjustment assembly to the first distal end of the leveling block;
    mounting a first threaded block of the slotted adjustment assembly to the backplane component; and
    coupling, via the first leveling adjustment bolt of the slotted adjustment assembly, the slotted block with the first threaded block.

13. The method of claim 12 further comprising disposing first spherical washers adjacent the slotted block on the first leveling adjustment bolt.

14. The method of claim 11, wherein a hole adjustment assembly is coupled between a second distal end of the leveling block and the backplane component.

15. The method of claim 14 further comprising:
    coupling a first pitch adjustment bolt to the first distal end of the leveling block;

coupling a second pitch adjustment bolt to the second distal end of the leveling block; and rotating one or more of the first pitch adjustment bolt or the second pitch adjustment bolt to cause the backplane component to be substantially coplanar with the EFEM.

16. The method of claim 14, wherein the backplane component comprises a seal, and wherein the slotted adjustment assembly and the hole adjustment assembly are operable to align the seal with the EFEM.

17. The method of claim 14 further comprising rotating a second leveling adjustment bolt in the hole adjustment assembly to further align the backplane component with the EFEM.

18. The method of claim 17 further comprising:
mounting a hole block of the hole adjustment assembly to the second distal end of the leveling block;
mounting a second threaded block of the hole adjustment assembly to the backplane component; and
coupling, via the second leveling adjustment bolt of the hole adjustment assembly, the hole block with the second threaded block.

19. The method of claim 18, wherein the hole block forms a through-hole having:
a first diameter at a lower end large enough to allow the first leveling adjustment bolt to swivel in the through-hole; and
a second diameter at an upper end small enough to retain the first leveling adjustment bolt at a fixed location.

20. The method of claim 18 further comprising disposing second spherical washers adjacent the hole block on the second leveling adjustment bolt.

* * * * *